United States Patent

Tanaka

Patent Number: 5,128,283
Date of Patent: Jul. 7, 1992

[54] METHOD OF FORMING MASK ALIGNMENT MARKS

[75] Inventor: Koukiti Tanaka, Tokyo, Japan

[73] Assignee: Nec Corporation, Tokyo, Japan

[21] Appl. No.: 363,124

[22] Filed: Jun. 8, 1989

[30] Foreign Application Priority Data

Jun. 8, 1988 [JP] Japan ................. 63-142284
Nov. 8, 1988 [JP] Japan ................. 63-282708

[51] Int. Cl.⁵ ............... H01L 21/465; H01L 21/312
[52] U.S. Cl. .................................. 437/228; 437/229;
437/924; 437/233; 437/235; 437/245
[58] Field of Search ............ 437/228, 229, 233, 235,
437/924, 245; 356/401; 250/492.1; 430/22

[56] References Cited

U.S. PATENT DOCUMENTS

| 3,600,241 | 8/1971 | Doo et al. | 437/924 |
| 3,802,940 | 4/1974 | Villers et al. | 437/924 |
| 4,134,066 | 1/1979 | Vogel et al. | 437/924 |
| 4,233,091 | 11/1980 | Kawabe | 437/99 |
| 4,356,223 | 10/1982 | Iida et al. | 356/401 |
| 4,640,888 | 2/1987 | Itoh et al. | 356/401 |
| 4,642,672 | 2/1987 | Kitakata | 430/22 |

FOREIGN PATENT DOCUMENTS

| 0061536 | 10/1982 | European Pat. Off. |  |
| 0039672 | 3/1980 | Japan | 437/924 |
| 0213425 | 12/1983 | Japan |  |
| 0027630 | 2/1986 | Japan | 437/924 |
| 0283039 | 11/1988 | Japan | 437/924 |

*Primary Examiner*—Brian E. Hearn
*Assistant Examiner*—Tom Thomas

[57] ABSTRACT

A method of producing a semiconductor device including processes of forming an optically transparent film on a semiconductor substrate having an alignment mark, and thereafter forming an optically opaque film, includes the step of selectively etching said transparent film to remove at least a part thereof disposed above said alignment mark, and thereafter forming said optically opaque film on said semiconductor substrate. A method of producing a semiconductor device including a step of making a measurement mark formed on a semiconductor substrate for measuring relative error amount caused during alignment inlcudes the steps of forming an optically transparent film on said semiconductor substrate provisionally formed with an aligning pattern of said measurement mark, thereafter selectively etching said transparent film to remove a region thereof above said aligning pattern of said measurement mark and to remove another region thereof for a later formed to-be-aligned pattern, thereafter forming an optically opaque film on said semiconductor substrate, and then coating a photo-sensitive film and carrying out exposue and development so as to form a remaining to-be-aligned pattern of said measurement mark.

4 Claims, 9 Drawing Sheets

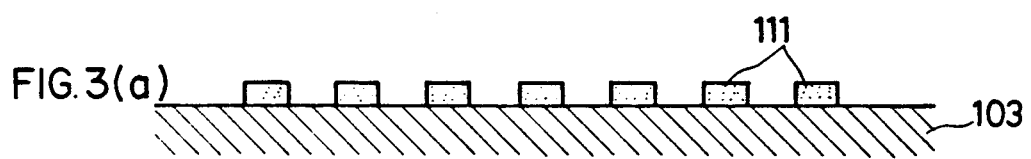
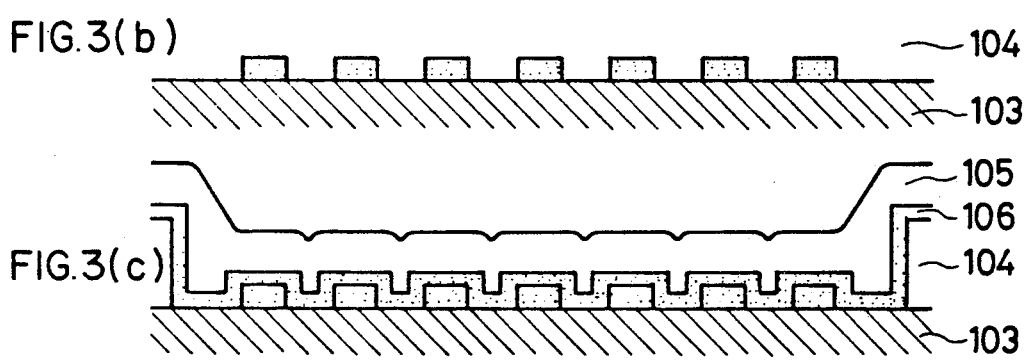
FIG. 3(a)
FIG. 3(b)
FIG. 3(c)
FIG. 3(d)

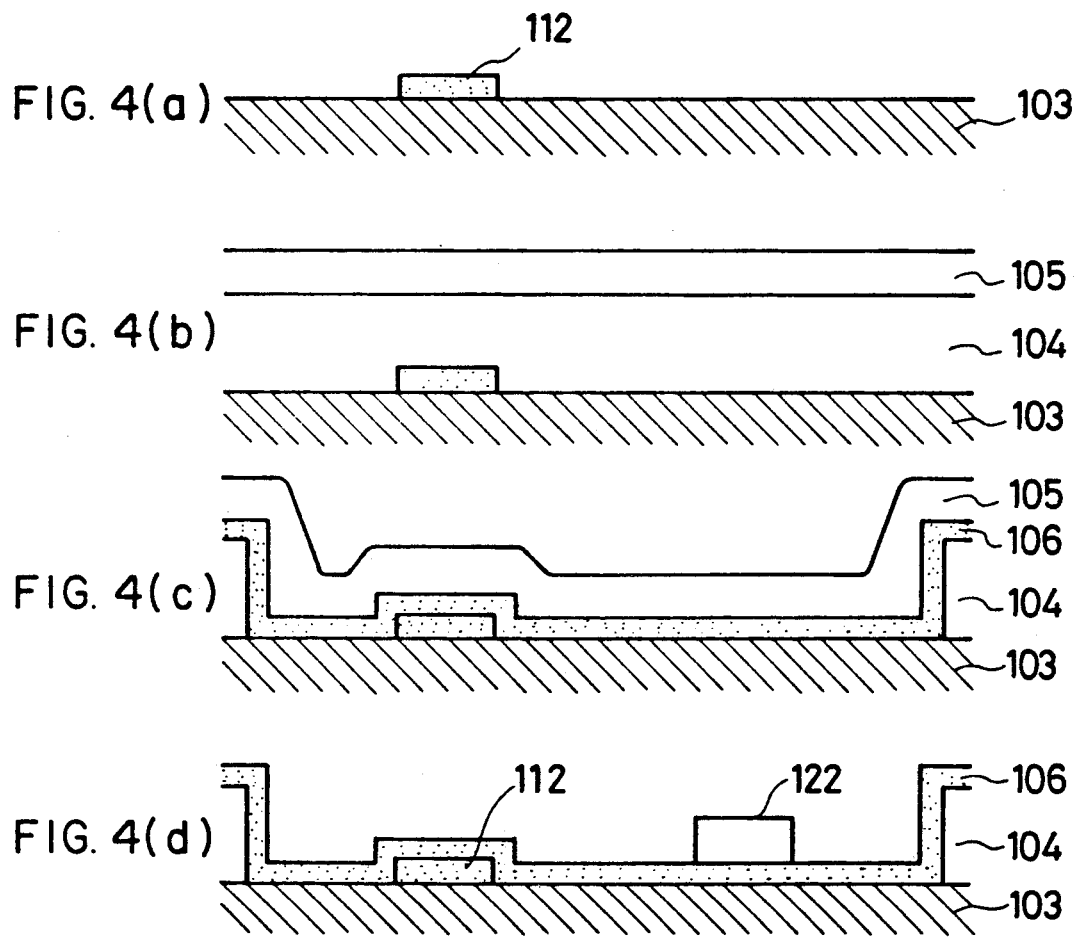

METHOD OF FORMING MASK ALIGNMENT MARKS

BACKGROUND OF THE INVENTION

The present invention relates to the method of making semiconductor device, and more specifically relates to method of forming alignment mark used for exposure instrument and method of forming measurement mark for measuring relative error caused in exposure alignment.

Conventionally, in the method of making semiconductor device, method of forming the alignment mark and aligning is such that, after forming a film over the semiconductor substrate, a part of circuit pattern is formed on the film through the process of photolithography and etching, and concurrently the alignment mark is formed on a margin portion of the circuit pattern. Then, after forming a next film for new processing step over the entire surface of semiconductor substrate and coating photoresist, exposure is carried out by using the exposure instrument. In the conventional technology, preferably alignment mark for use in each processing step is provisionally formed by a particular film pattern which has the smallest design margin between circuit patterns and which is needed the highest accuracy of relative positioning. Accordingly, alignment mark formed by the particular film pattern may be used mutually in the subsequent processing steps. Further, since the most general alignment method utilizes reflecting light or refracting light from the alignment mark without regard to the exposure methods of X-ray, electron beam and infrared light, the alignment mark is preferably formed of opaque film such as polysilicon, metal silicide and aluminium used as electrode material and lead pattern material or comprised of steps on the semiconductor substrate, rather than a film having a very high transmitivity for alignment light, such as SiO2 (silicon dioxide) and PSG (phosphorus siligate glass).

FIG. 5 shows an example of such conventional manufacturing method. In the step of forming gate electrode material on a semiconductor substrate 31, an alignment mark 32 is concurrently formed (FIG. 5 (a)). Next, insulating layer film is formed in the form of PSG film (phosphorus siligate glass) 33 and transparent SiO2 (silicon dioxide) film 34 (FIG. 5 (b)). In order to carry out subsequent patterning on the gate electrode, a processing step is needed to remove a part of this insulating inter-layer film positioned above the gate electrode. Such processing step is generally called contact step. Such contact hole must be precisely formed without positional deviation with respect to the gate electrode. Accordingly, in order to eliminate alignment error due to indirect factors, the positioning is carried out by using the alignment mark 32 provisionally formed from the gate electrode material. After the contact step, in order to carry out the next lead patterning step, lead pattern material 36 is disposed on the semiconductor substrate and thereafter photoresist 35 is coated so as to carry out exposure. In this case, in view of the design margin, since the lead patterning should be carried out in precise positional relation to the contact hole, an alignment mark should be preferably formed of the insulating inter-layer film. However, it is optically transparent material, and therefore actually the mark made of gate electrode material (opaque film) having relatively strict design margin is substitutionally used in place thereof (FIG. 5 (c)).

In the above described conventional method of manufacturing the semiconductor device, in view of the recent improvement in the device fabrication technology, circuit pattern is extremely complicated. In memory device of the most advanced ultra-LSI, contact step and patterning step are repeatedly carried out several times. Accordingly, in the later steps, unevenness becomes great on the semiconductor surface to cause problem that the adhesiveness of lead pattern material in the circuit pattern is impaired. Accordingly, in the memory device of most advanced large capacity, in order to eliminate unevenness of semiconductor substrate surface developed in later steps, introduction of leveling process is proposed, such that thickness of the insulating inter-layer film is increased twice or trice as much as in the conventional technology so as to level the surface. Consequently, as shown in FIG. 5 (c), in the lead patterning process, since the lead pattern material 36 composed of opaque film is disposed on the insulating inter-layer film having substantially smooth surface, alignment light irradiated from above the alignment mark 32 is reflected by the surface of lead pattern material 36. In the alignment method utilizing reflecting light or refracting light, when the unevenness due to the mark is relatively small on the surface around the alignment mark, since S/N of alignment signal defected from the alignment mark becomes weak, it is obvious to affect the alignment accuracy.

Further, conventionally in the method of marking the semiconductor device, method of forming measurement mark for measuring amount of alignment error is such that, firstly a film is formed over the semiconductor substrate, and thereafter a part of circuit pattern is formed by the film through lithography and etching process and concurrently reference or aligning pattern of the measurement mark for measuring the alignment error amount (such reference pattern is generally called male pattern, and therefore hereinafter referred to as male pattern) is formed on a margin portion of the circuit pattern. Then, after forming another film used in subsequent processing step over the entire surface of semiconductor substrate and coating photoresist, exposure is carried out by using exposure instrument. Then, mask pattern for etching is formed by developing process on the semiconductor substrate, and concurrently a remaining to-be-aligned pattern (generally called female pattern and therefore hereinafter referred to as female pattern) of the measurement mark is formed for measuring alignment error amount related to the exposure result on a margin portion of the circuit pattern.

In this conventional technology, the positioning must be carried out most accurately for a pattern having the least design margin among the previously formed circuit pattern. In view of this, the male pattern of measurement mark must be provisionally formed by a particular coating film having the most strict design margin. Accordingly, a plurality of processing steps may be interposed before forming the female pattern.

FIG. 6 is a plan view of mark for measuring alignment error amount by visual check through the conventionally used microscope (such mark is generally called vernier). The vernier is comprised of a male pattern 111 and a female pattern 112. By using pitch difference between the male and female patterns 111 and 112, the relative deviation amount (amount of scale of vernier)

between the patterns is visually read to measure the alignment error amount.

FIG. 8 is production step chart taken along line A-A of FIG. 6 to show an example of the conventional manufacturing steps. In the step of forming gate electrode on the semiconductor substrate 103, the male pattern 111 is formed of gate electrode material (FIG. 8 (a)). Next, an optically transparent film 104 such as PSG (phosphorus siligate glass) film and SiO2 (silicon dioxide) film is formed as an insulating inter-layer film (drawing omitted). In order to carry out following lead patterning on the gate electrode, a process step is carried out to remove a part of the insulating inter-layer film 104 just above the gate electrode (such process step is generally called contact step). In general, in order to avoid short-circuit of lead pattern, it is not necessary to remove the insulating inter-layer film other than that corresponding to the gate electrode. Accordingly, a portion of the insulating inter-layer film 104 is left as it is on the male pattern 111. After the contact step, in order to proceed to subsequent patterning step, optically opaque lead material 106 such as aluminium is formed on the semiconductor substrate, and thereafter photoresist 105 is coated (FIG. 8 (b)). Next, after carrying out exposure by exposure instrument and developing process, female pattern 121 is formed. Generally, in view of the design margin, removal of the insulating inter-layer film and lead patterning must be carried out precisely to the given position on the gate electrode without causing short-circuit and open-circuit. Accordingly, the female pattern 121 shown in FIG. 8 (c) is formed relative to the male pattern of vernier provisionally formed from the gate electrode material so as to read the alignment error amount to carry out feedback compensation effective to reduce the alignment error during the exposure process in the patterning step to zero as close as possible.

FIG. 7 is a plan view of measurement mark used for measuring alignment error amount according to other conventional optical length-measurement method. This optical length-measurement method is such that laser beam light having a given wavelength and spot size is scanned in the direction of line B—B, and scattered light or positive reflected light from the male pattern 112 and female pattern 122 is detected by a given detection system so that the obtained signal is processed by computer to determine the distance between the pair of patterns. The distance between the pair of patterns is compared to predetermined design value, and the difference between the design value and the measured value is alignment error amount. FIG. 9 is a production step chart shown along B—B line of FIG. 7. The flow of production steps is similar to that of the conventional method explained in conjunction with FIG. 8.

In the above described conventional production method of semiconductor device, in view of the recent improvement of device production technology, the circuit pattern becomes considerably complicated. Therefore, in the most advanced large capacity memory product of ultra-LSI, the contact step and the patterning step are repeatedly carried out several times. Accordingly, in later steps, unevenness of the semiconductor substrate surface becomes greater, resulting in causing a problem that the adhesiveness of lead pattern material is impared in the circuit pattern.

Thus, in the most advanced large capacity memory products, in order to eliminate unevenness of the semiconductor surface developed in the later steps, a leveling process is proposed such that the thickness of an insulating inter-layer film is increased twice or trice as much as usual so as to level the surface. Accordingly, in the lead patterning step shown in FIG. 8 (c) and FIG. 9 (c), optically opaque lead pattern material is formed on the insulating inter-layer film 104 having an almost perfectly smooth surface.

Further, in both cases, the male pattern of alignment error amount measurement mark is formed under the smooth insulating inter-layer film. When undertaking a visual check from above the pattern by means of an optical microscope, it is impossible to recognize the step portion of male pattern, because the lead pattern material of upper layer is optically opaque and has the surface almost perfectly formed in the flat shape. With regard to the optical distance-measurement method, in a similar way, due to the flatness of surface, it is impossible to recognize the pattern, because the scattered light or positive reflecting light from the pattern edge with utilizing unevenness of the male pattern is very weak and the S/N ratio of the detected signal is also very weak. Accordingly, when applying the conventional method of producing a semiconductor device, there may be caused a drawback such that the measurement of the alignment error amount is impossible because the male pattern cannot be recognized.

SUMMARY OF THE INVENTION

An object of the present invention is to, therefore, provide an improved method of making a semiconductor device in order to eliminate the above described drawback of the conventional method.

According to one aspect of the present invention, in the method of producing a semiconductor device including processes of forming an optically transparent film on a semiconductor substrate having an alignment mark, and thereafter forming an optically opaque film, the method is characterized by the steps of: selectively etching said transparent film to remove at least a part thereof disposed above said alignment mark; and thereafter forming said optically opaque film on said semiconductor substrate. The method includes the steps of, after forming said optically opaque film, coating a photosensitive organic film, and carrying out positioning and exposure with using said alignment mark by means of an exposure instrument.

According to another aspect of the invention, in the method of producing a semiconductor device including a step of making a measurement mark formed on a semiconductor substrate for measuring relative error amount caused during alignment, the method is characterized by the steps of: forming an optically transparent film on said semiconductor substrate provisionally formed with an aligning pattern of said measurement mark; thereafter selectively etching said transparent film to remove a region thereof above said aligning pattern of said measurement mark and to remove another region thereof for a later formed to-be-alinged pattern; thereafter forming an optically opaque film on said semiconductor substrate; and then coating a photosensitive film and carrying out exposure and development so as to form a remaining to-be-aligned pattern of said measurement mark. The method includes the step of measuring relative error amount caused during alignment with using said measurement mark so as to determine whether said alignment is acceptable or not.

BRIEF DESCRIPTION OF THE DRAWINGS (a)-(d) are a production step chart of a first embodiment according to the invention;

FIGS. 2 (a) -(d) are a production step chart of a second embodiment according to the invention;

FIGS. 3 (a)-(d) are a production step chart of a third embodiment according to the invention, taken along line A—A of FIG. 6;

FIG. 4 is a production step chart of a fourth embodiment according to the invention, taken along line B—B of FIG. 7;

FIGS. 5 (a) -(c) are a production step chart of the conventional technology;

Figure 1A:
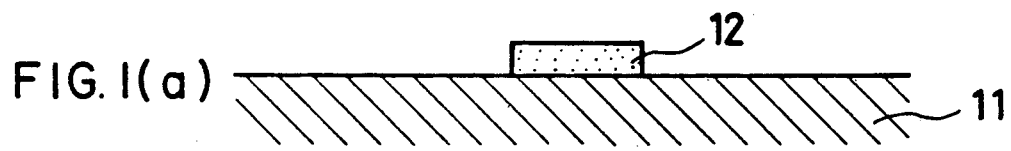
Figure 1B:
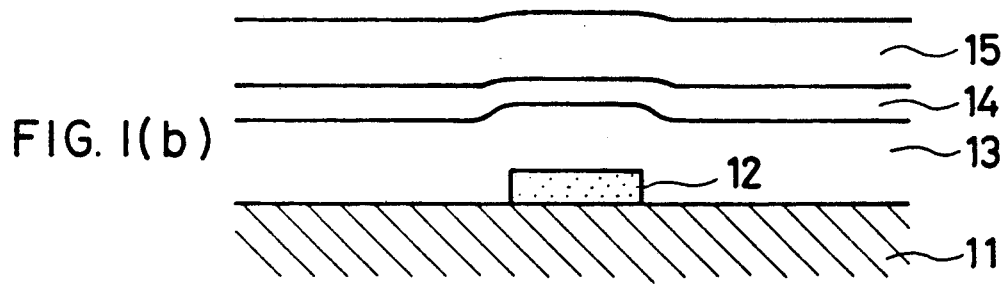
Figure 1C:
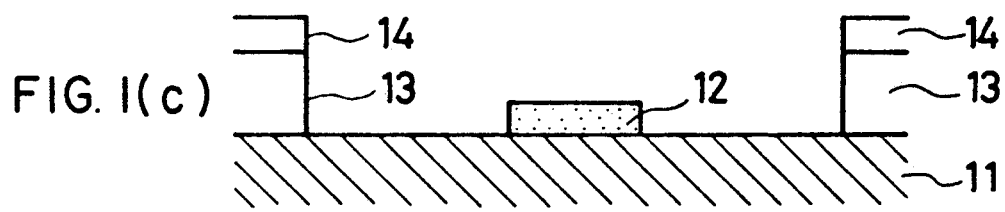
Figure 1D:
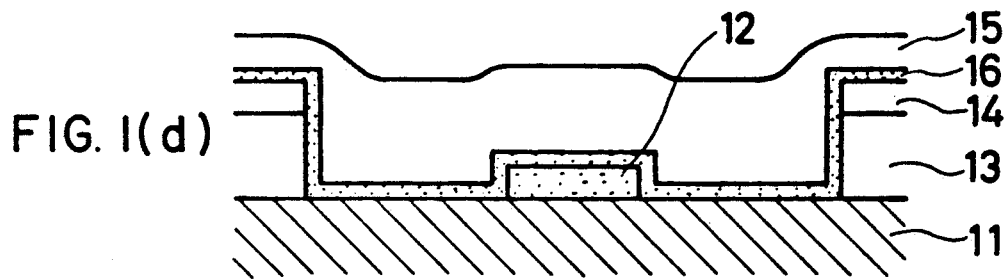
Figure 2A:
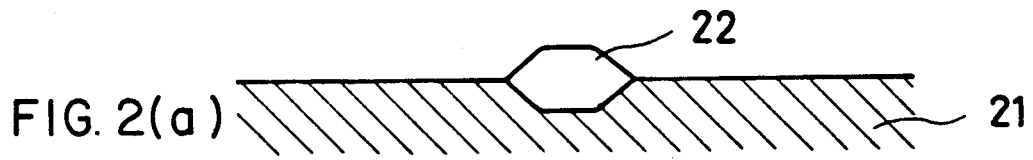
Figure 2B:
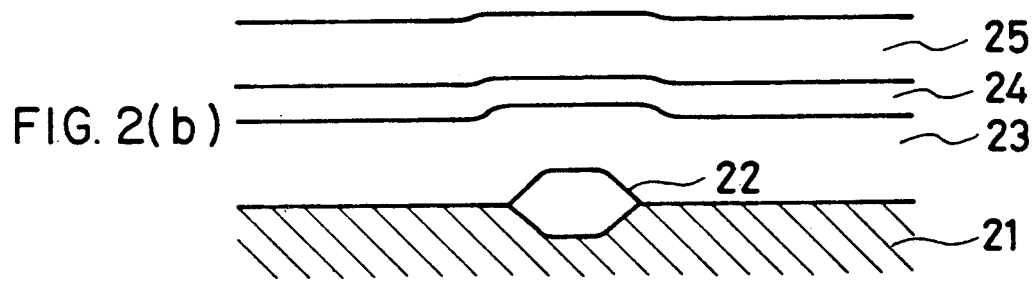
Figure 2C:
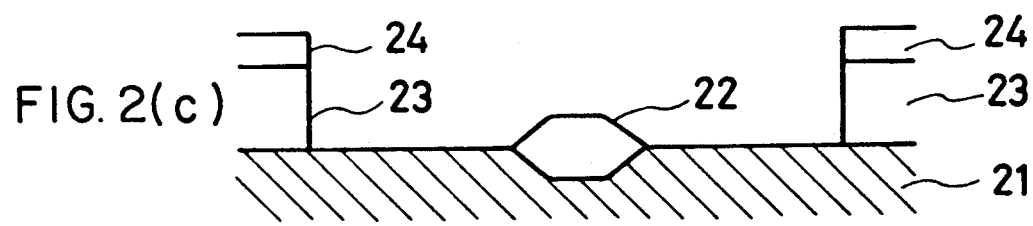
Figure 2D:
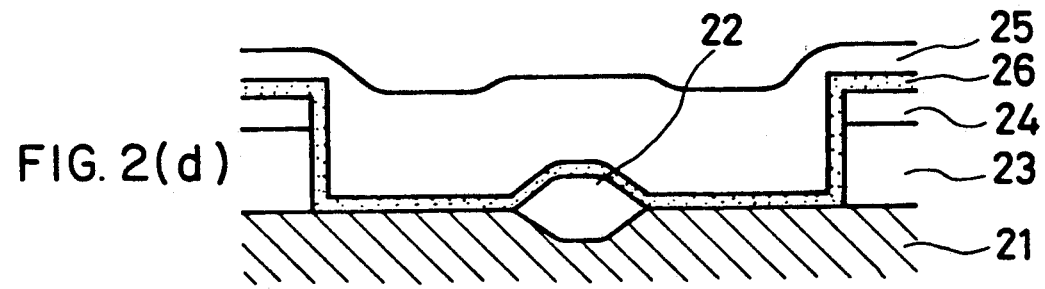
Figure 5A:
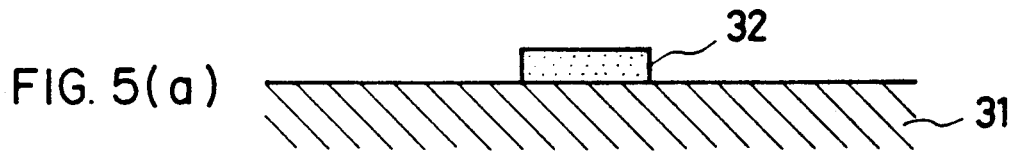
Figure 5B:
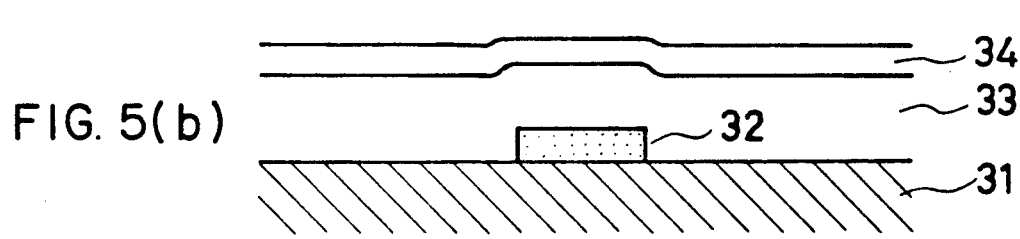
Figure 5C:
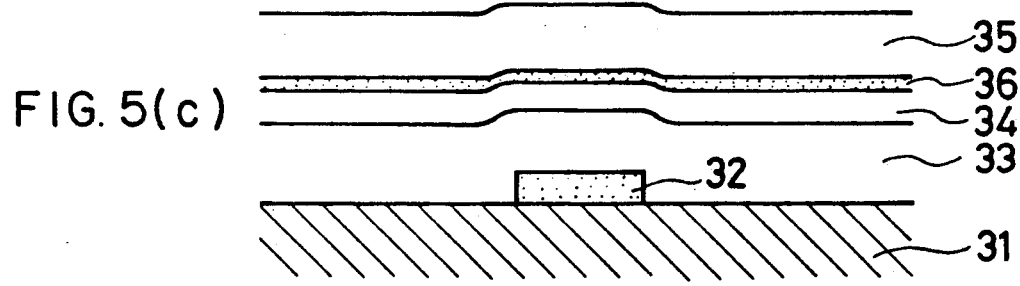
Figure 6:
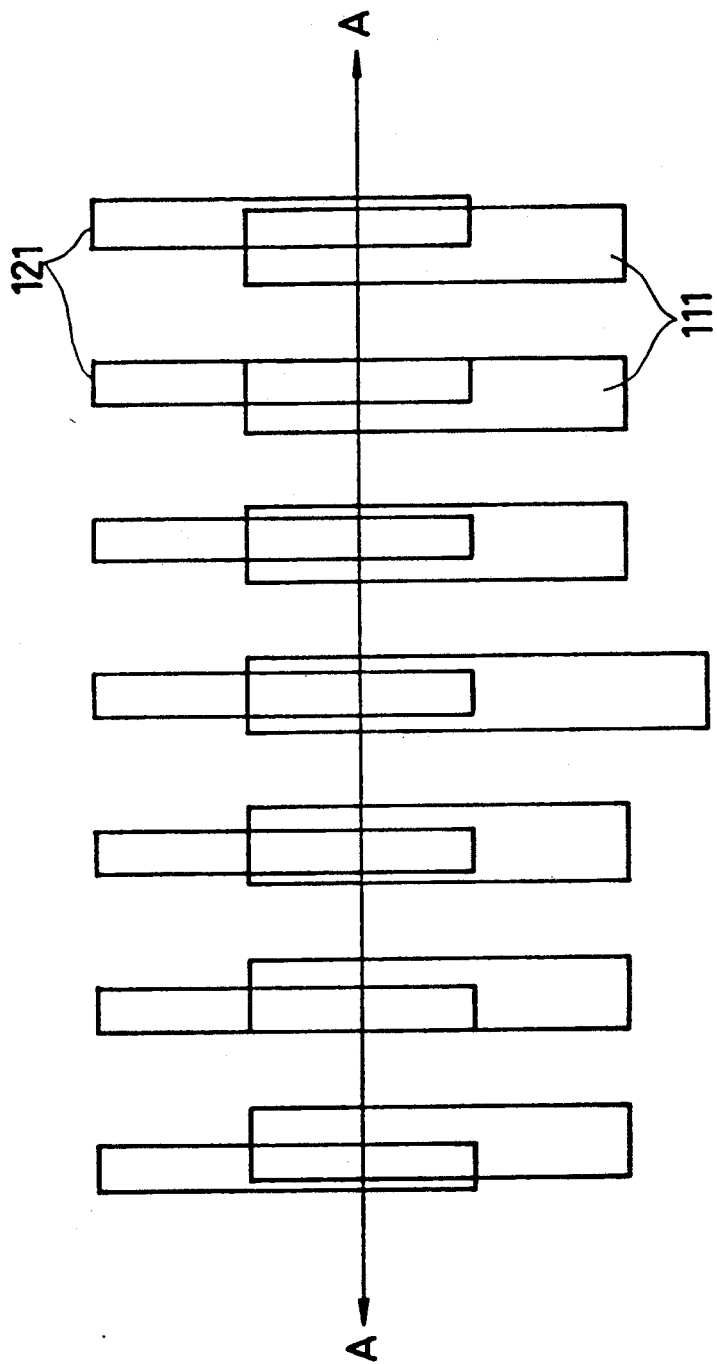
FIG. 6 is a plan view of a measurement mark (vernier) for measuring alignment error amount by visual check.
Figure 7:
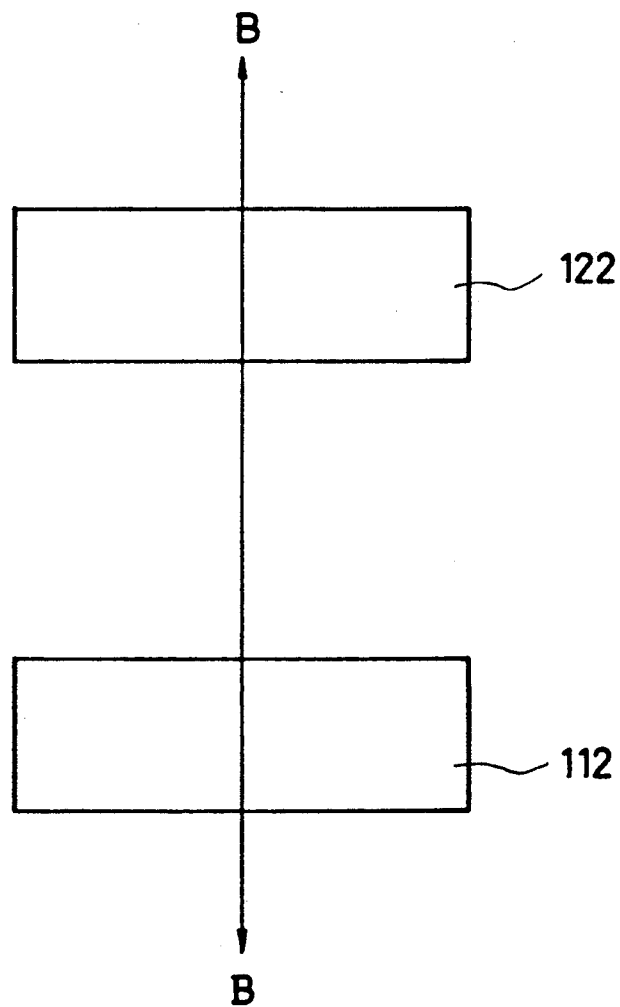
FIG. 7 is a plan view of a measurement mark for measuring alignment error amount according an optical distance measurement method.
Figure 8A:
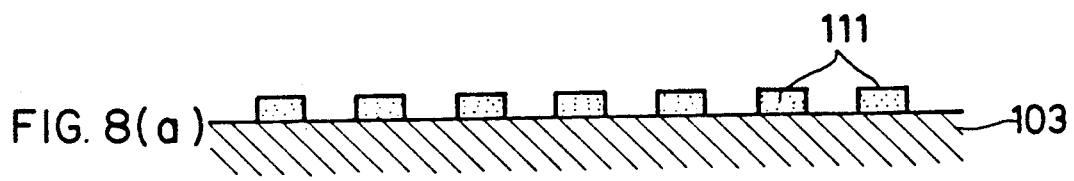
Figure 8B:
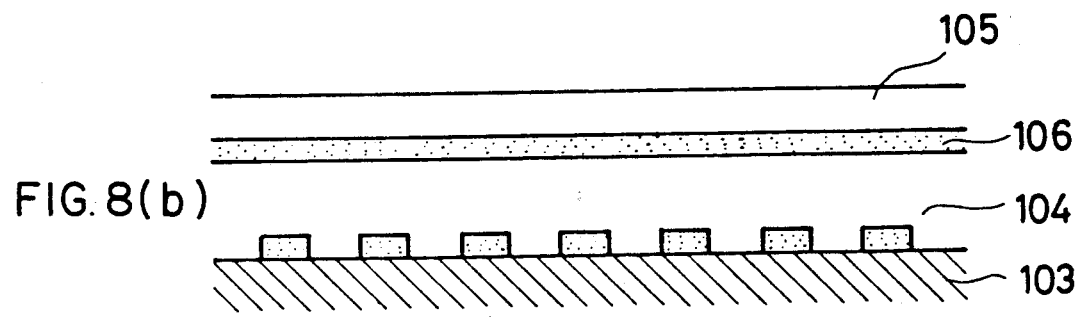
Figure 8C:
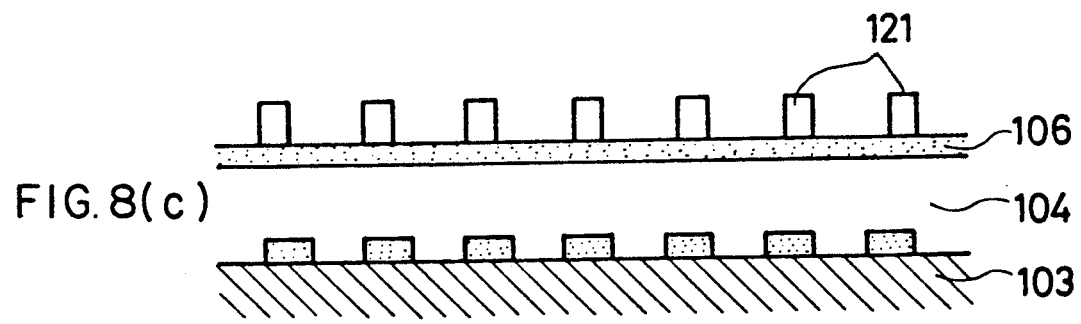
Figure 9A:
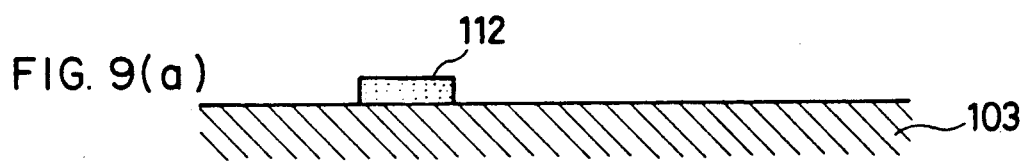
Figure 9B:
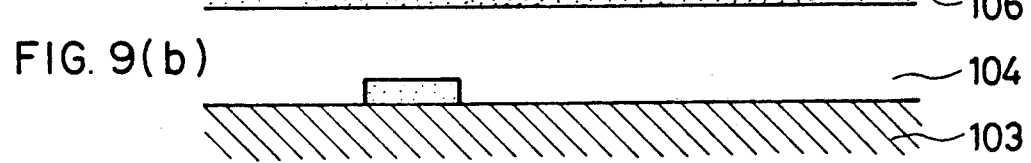
Figure 9C:
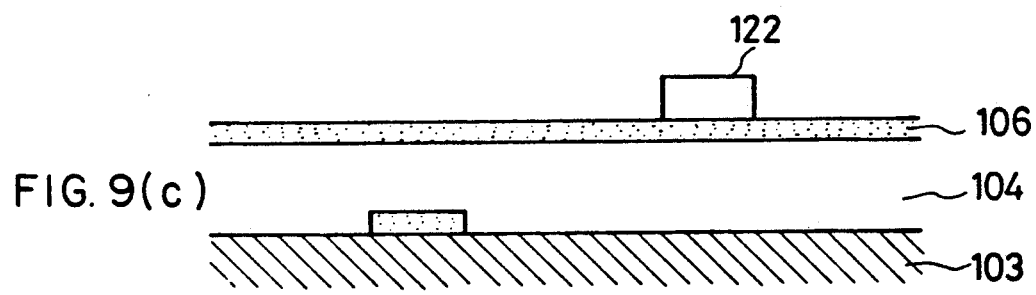

FIGS. 8 (a)-(c) are a production step chart of the conventional technology, taken along line A—A of FIG. 6;

and FIGS. 9 (a)-(c) are a production step chart of other conventional technology, taken along line B—B of FIG. 7.

DETAILED DESCRIPTION OF PREFERRED EMBODIMENTS

Next, the present invention is explained in conjunction with the drawings. FIG. 1 is a production step chart of first embodiment according to the present invention. The steps of FIG. 1 (a) and 1 (b) are similar to the prior art, in which insulating inter-layer films 13 and 14 are formed over the entire surface of semiconductor substrate 11 containing alignment mark 12 formed of gate electrode material, and photoresist 15 is coated thereon so as to prepare for an exposure process. Though omitted in the description of prior art, since the insulating inter-layer film and photoresist are of an optically transparent film, alignment light substantially perfectly reaches to the surface of alignment mark 12 without regard to the thickness and surface evenness of these films, and reflected or refracted light from the alignment mark is easily detected to thereby effect the alignment precisely without any problem. Next in the contact step to remove the insulating inter-layer film just over the gate electrode by means of developing process and etching, a part of the insulating inter-layer film is concurrently removed from an area around the alignment mark 12 (FIG. 1 (c)). Next, in order to carry out the lead patterning process, after forming an optically opaque lead pattern material on the semiconductor substrate, photoresist is coated and the positioning of mask and exposure are carried out. At this time, as shown in FIG. 1 (d), the lead pattern material is directly adhered to the alignment mark. Then, since the film of polysilicon, metal silicide or aluminium normally used as lead pattern material can be formed in extremely uniform thickness with respect to the under-layer pattern, the unevenness on the alignment layer is reserved as it is. Consequently, since the reflected or refracted light from the alignment mark can be easily detected, the alignment can be carried out precisely without any problem.

Next, a second embodiment of the present invention is explained in conjunction with FIG. 2.

In this embodiment, there is used an alignment mark 22 formed of element-isolation insulating film. The element-isolation insulating film is called generally LOCOS oxide film, and as shown in FIG. 2, it is selectively formed in the semiconductor substrate 21. Then, a surface portion thereof has a shape raised from the semiconductor substrate 21. Since this alignment mark is of optically transparent film, alignment light can pass through the alignment mark 22. Then, the reflected or refracted light obtained due to unevenness of the boundary between the optically opaque semiconductor substrate 21 and the alignment mark 22 is detected so as to carry out the positioning operation with sufficient accuracy. Further, even when the optically opaque lead pattern material 26 is formed on the alignment mark 22, as shown in FIG. 2, the positioning operation can be carried out with sufficient accuracy by utilizing the unevenness on the alignment mark 22.

FIG. 3 is a production step chart taken along line A—A of FIG. 6 to show a third embodiment of production step according to the invention. In the step of FIG. 3 (a), as similar to the prior art, a male pattern 111 is formed of the gate electrode material on the semiconductor substrate 103. Then, an optically transparent insulating inter layer film 104 is formed on the entire surface of semiconductor substrate 103, and photoresist 105 is coated thereon and the exposure is carried out (FIG. 3 (b)). Further, in the contact step to remove selectively the insulating inter-layer film by means of developing process and etching, a part thereof is concurrently removed from a region around the male pattern 111 and another region around a later-formed female pattern. Then, in order to carry out a lead patterning process step, optically opaque lead pattern material 106 is formed on the semiconductor substrate, and thereafter photoresist 105 is coated and the exposure process is carried out (FIG. 3 (c)). Further, after a developing process, female pattern 121 is formed according to the photoresist (FIG. 3 (d)). At this time, as shown in the figure, the lead pattern material adheres directly to the male pattern. Then, since the film made of such as aluminium normally used as the lead pattern material can be formed at very uniform thickness relative to the under-layer pattern, the unevenness on the male pattern can be reserved as it is. Accordingly, the male pattern of vernier can be recognized visually, and the measurement of alignment error amount can be carried out by means of the vernier without a problem.

Next, a fourth embodiment is explained according to the present invention. FIG. 4 is a production step chart taken along line B—B of FIG. 7 to show the production steps of this embodiment. While the third embodiment utilizes the vernier, the fourth embodiment utilizes a measurement mark for measuring the alignment error amount according to the optical distance measurement method. As shown in FIG. 4 (c), the lead pattern material is disposed while reserving the unevenness of an under-layer pattern uniformly as it is. Accordingly, the signal according to the scattered light and positive reflecting light from the edge of male pattern 112 is detected with good S/N ratio, hence the measurement of the alignment error amount is similarly carried out without any problem.

As described above, according to the present invention, even after forming an optically transparent insulating inter-layer film at a thickness sufficient to level the surface thereof in order to carry out the leveling process on the semiconductor substrate including the alignment mark, only by introducing the step of removing a part of the insulating inter-layer film from around the alignment mark in the sequential processes of lithography and etching during the contact step immediately thereafter, the alignment can be effectively carried out without any problem even when various opaque films are formed on the semiconductor substrate in the later steps such as a lead patterning step.

In addition, the embodiments have been explained with using the same alignment mark during the exposure process of an optically transparent film (insulating inter-layer film) and during the exposure process of an opaque film (lead pattern material film) for the simplification of description. However, the present invention can provide the similar effect without any problem even when the alignment mark for use in the exposure process of optically transparent film is different from that for later use in the exposure process of an opaque film.

Further, as described above, according to the present invention, in order to carry out the leveling process on the semiconductor substrate, an optically transparent insulating inter-layer film may be formed very thick to smooth the surface thereof. Even in such case, immediately thereafter, in the sequential processes of lithography and etching of the contact step, by only introducing the method of removing at least a peripheral portion on the male pattern of the alignment error amount measurement mark and a peripheral portion of the female portion, the measurement of alignment error amount can be precisely effectively carried out without any problem even when various opaque lead pattern material films are formed on the semiconductor substrate in the later lead patterning steps and so on.

What is claimed is:

1. A method of producing a semiconductor device including processes of forming an optically transparent film on a semiconductor substrate having an alignment mark, and thereafter forming an optically opaque film, the method comprising the steps of: selectively etching said transparent film to remove at least a part thereof disposed above said alignment mark; and thereafter forming said optically opaque film on said semiconductor substrate.

2. A method as claimed in claim 1; including the steps of, after forming said optically opaque film, coating a photosensitive organic film, and carrying out positioning and exposure with using said alignment mark by means of an exposure instrument.

3. A method of producing a semiconductor device including a step of making a measurement mark formed on a semiconductor substrate for measuring relative error amount caused during alignment, the method comprising the steps of: forming an optically transparent film on said semiconductor substrate provisionally formed with an aligning pattern of said measurement mark; thereafter selectively etching said transparent film to remove a region thereof above said aligning pattern of said measurement mark and to remove another region thereof for a later formed to-be-aligned pattern; thereafter forming an optically opaque film on said semiconductor substrate; and then coating a photosensitive film and carrying out exposure and development so as to form a remaining to-be-aligned pattern of said measurement mark.

4. A method as claimed in claim 3 including the step of: measuring the relative error amount caused during alignment with using said measurement mark so as to determine whether said alignment is acceptable.

* * * * *